(12) United States Patent
Link et al.

(10) Patent No.: US 6,170,151 B1
(45) Date of Patent: Jan. 9, 2001

(54) UNIVERSAL UNIT STRIP/CARRIER FRAME ASSEMBLY AND METHODS

(75) Inventors: Joseph Link, Pleasanton; Kurt Raab, San Jose, both of CA (US)

(73) Assignee: Tessera, Inc., San Jose, CA (US)

( * ) Notice: Under 35 U.S.C. 154(b), the term of this patent shall be extended for 0 days.

(21) Appl. No.: 09/443,530

(22) Filed: Nov. 19, 1999

Related U.S. Application Data

(62) Division of application No. 09/012,590, filed on Jan. 23, 1998, now Pat. No. 6,049,972.
(60) Provisional application No. 60/040,020, filed on Mar. 4, 1997.

(51) Int. Cl.[7] .................................................. B23P 19/04
(52) U.S. Cl. ............................ 29/740; 29/564; 29/564.1; 29/741; 29/827; 29/729; 29/650
(58) Field of Search .......................... 29/564, 564.1, 29/564.6, 740, 741, 827, 729, 738, 650; 257/670; 438/111

(56) References Cited

U.S. PATENT DOCUMENTS

| | | | |
|---|---|---|---|
| 5,008,997 | 4/1991 | Phy ........................................ | 29/827 |
| 5,023,202 | * 6/1991 | Long et al. ............................. | 29/827 |
| 5,032,542 | 7/1991 | Kazami et al. ....................... | 437/206 |
| 5,148,265 | 9/1992 | Khandros et al. .................... | 357/80 |
| 5,148,266 | * 9/1992 | Khandros et al. .................... | 257/773 |
| 5,182,851 | * 2/1993 | Bond et al. ............................ | 29/827 |
| 5,225,373 | 7/1993 | Takahashi et al. ................... | 437/209 |
| 5,268,331 | 12/1993 | Abbott ................................. | 437/225 |
| 5,281,556 | 1/1994 | Shimizu et al. ...................... | 437/206 |
| 5,352,633 | * 10/1994 | Abbott ................................. | 156/233 |
| 5,357,674 | * 10/1994 | Lumbard ............................... | 29/843 |
| 5,378,656 | 1/1995 | Kajihara et al. ...................... | 437/217 |
| 5,384,286 | 1/1995 | Hirai ..................................... | 437/207 |
| 5,408,050 | * 4/1995 | Kashio et al. ...................... | 174/117 F |
| 5,411,920 | 5/1995 | Shibata ................................. | 437/217 |
| 5,566,448 | * 10/1996 | Bhatt et al. ............................ | 29/840 |
| 5,640,746 | 6/1997 | Knecht et al. ...................... | 29/25.35 |
| 5,659,952 | * 8/1997 | Kovac et al. .......................... | 29/840 |
| 5,661,086 | 8/1997 | Nakashima et al. ................. | 257/668 |
| 5,778,520 | 7/1998 | Kim et al. ............................. | 29/827 |
| 5,802,709 | 9/1998 | Hogge et al. .......................... | 29/827 |
| 5,807,453 | 9/1998 | Smith et al. ......................... | 156/150 |
| 5,822,848 | 10/1998 | Chiang ................................. | 29/827 |
| 5,852,870 | 12/1998 | Freyman et al. ...................... | 29/841 |
| 5,854,741 | 12/1998 | Shim et al. .......................... | 361/813 |

FOREIGN PATENT DOCUMENTS

| | | | |
|---|---|---|---|
| 56-115550 | 9/1981 | (JP) | ...................................... 29/827 |
| 2-156547 | 6/1990 | (JP) | ...................................... 29/827 |
| 58-57743 | 4/1993 | (JP) | ...................................... 29/827 |
| 5-259363 | 10/1993 | (JP) | ...................................... 29/827 |

* cited by examiner

Primary Examiner—Stephen F. Gerrity
Assistant Examiner—Rhonda E Sands
(74) Attorney, Agent, or Firm—Lerner, David, Littenberg, Krumholz & Mentlik, LLP

(57) ABSTRACT

An assembly for processing a flexible tape comprises a carrier frame having a slot and a cut-out region contiguous with one end of the slot for selectively transferring the flexible tape from the top surface of the carrier frame to the bottom surface of the carrier frame. An apparatus for processing the flexible tape is also disclosed and includes the carrier frame, a base having an aperture and a platform sized to fit within the aperture of the base. The base is pivotable around one end of the platform.

7 Claims, 17 Drawing Sheets

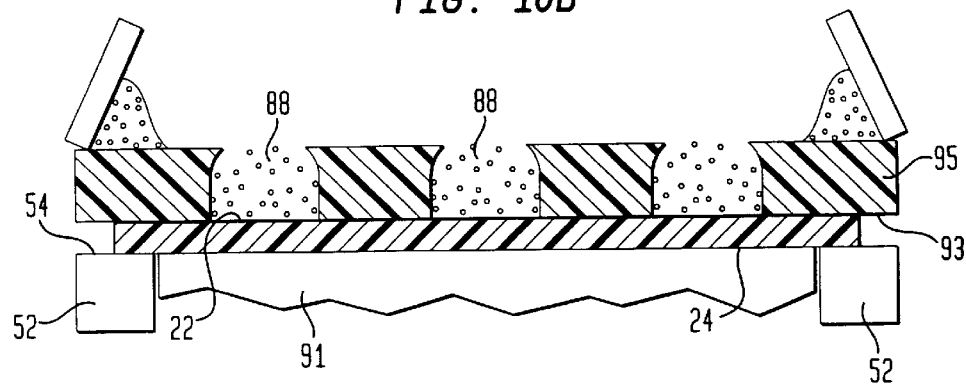
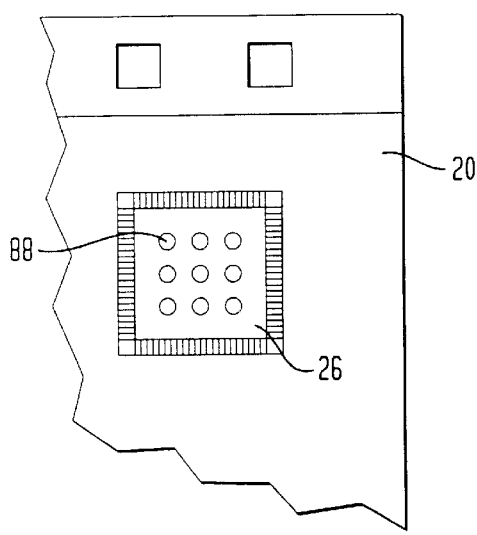
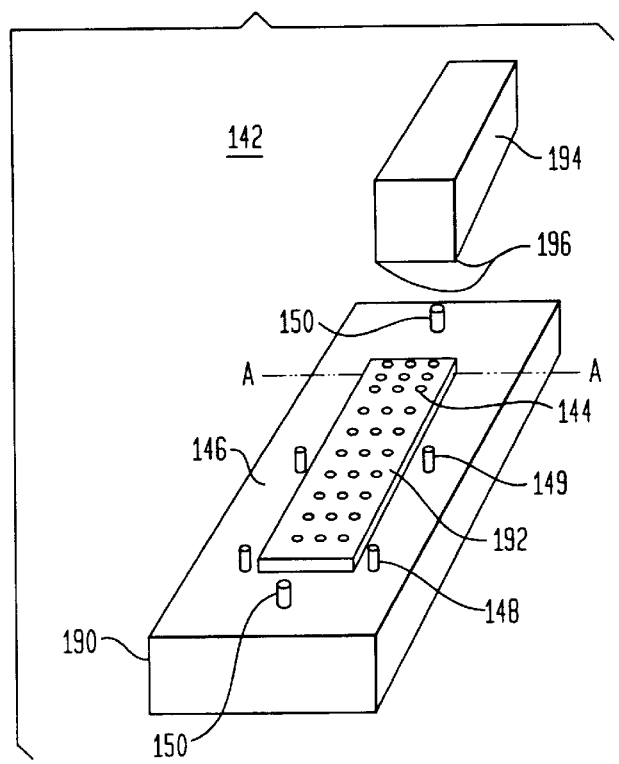

UNIVERSAL UNIT STRIP/CARRIER FRAME ASSEMBLY AND METHODS

CROSS REFERENCE TO RELATED APPLICATIONS

This application is a divisional of U.S. patent application Ser. No. 09/012,590, filed Jan. 23, 1998, now U.S. Pat. No. 6,049,972 the disclosure of which is hereby incorporated by reference herein. This application claims benefit of U.S. Provisional Application Ser. No. 60/040,020 filed Mar. 4, 1997, the disclosure of which is incorporated by reference herein.

FIELD OF THE INVENTION

The present invention relates generally to microelectronic assemblies and more particularly relates to methods of mass producing semiconductor chip assemblies.

BACKGROUND OF THE INVENTION

A semiconductor chip is generally connected to an external circuit element through contacts on the front face of the chip. For example in the tape automated bonding process (hereinafter referred to as the "TAB" process), a dielectric sheet, such as a thin foil of polyimide, is provided with one or more bond windows and an array of metallic leads on one surface thereof. Each lead has one end integrally connected to terminals on the dielectric sheet and an opposite end extending outwardly from a central portion of the dielectric sheet so that the outermost ends of the leads project beyond the bond windows. The dielectric sheet is juxtaposed with the semiconductor chip so that the bond windows are aligned with the contacts on the chip and so that the outermost ends of the leads overlie the front face of the chip. The leads are then bonded to the contacts of the chip using bonding techniques such as ultrasonic or thermocompression bonding. After the bonding step, the terminals are connected to an external circuit element, such as a printed circuit board, which electrically interconnects the chip and the printed circuit board.

Commonly assigned U.S. Pat. No. 5,148,266, the disclosure of which is incorporated by reference herein, discloses a method of manufacturing semiconductor chip assemblies which are fabricated in a substantially continuous sheet or strip. A plurality of connection components are spaced lengthwise along a continuous tape, each connection component having terminals and flexible leads thereon. In one assembly method, semiconductor chips are connected to respective connection components on the tape and the assembled semiconductor chips are then carried downstream with the tape for further processing steps.

Commonly assigned U.S. Pat. No. 5,659,952, the disclosure of which is incorporated by reference herein, provides methods of fabricating a semiconductor chip assembly having a compliant interface. In preferred methods according to U.S. Pat. No. 5,659,952, a flexible, substantially inextensible dielectric film having a surface is provided and a plurality of compliant pads are attached to the first surface of the dielectric film, whereby any two adjacent compliant pads define a channel therebetween. Attaching the compliant pads to the dielectric film may be accomplished in a number of different ways. In one embodiment, a stencil mask having a plurality of holes extending therethrough is placed on top of the first surface of the dielectric film. The holes in the stencil mask are then filled with a curable liquid elastomer. Desirably, liquid elastomer has a thick enough consistency so that the mask may be removed before curing the elastomer. After the mask has been removed, the elastomer is at least partially cured using energy, such as heat or ultraviolet light. The holes in the mask are preferably filled with the liquid elastomer by screening the liquid elastomer across an exposed surface of the mask such that the elastomer is deposited into the holes of the mask. Thus, there is provided an assembly which includes an array or plurality of compliant pads defining channels therebetween, i.e. the channels run between adjacent compliant pads.

In further stages of the process disclosed in U.S. Pat. No. 5,659,952, the assembly including the array of compliant pads is assembled to a second support structure, such as a semiconductor chip having a front face with contacts. During the assembly step, the front contact bearing face of the chip is abutted against the array of compliant pads and the contacts are electrically connected to terminals on a second surface of the dielectric film remote from the chip. A compliant filler, such as a curable liquid elastomer, may then be injected into the channels between the semiconductor chip and the dielectric film and around the compliant pads while the chip and the dielectric film are held in place. The curable liquid elastomer may then be cured to form a substantially uniform, planar, compliant layer between the chip and the dielectric film.

However, further improvements in handling of the components during assembly processes, such as those described in U.S. Pat. No. 5,659,952, would be desirable.

SUMMARY OF THE INVENTION

In accordance with one aspect of the present invention, a method of making a microelectronic assembly includes the steps of providing a flexible tape having first and second surfaces and including a plurality or array of connection components in a central region thereof. The flexible tape typically includes a dielectric film, such as a polyimide, whereby each connection component includes a part of the dielectric film having electrically conductive parts. The flexible tape includes one or more border regions which surround the central region bearing the plurality of connection components. The electrically conductive parts typically comprise an array or plurality of conductive terminals accessible at one surface of the dielectric film and may also include flexible leads integrally connected to the terminals. Each connection component also includes an attachment region for receiving a resilient element, such as an array or plurality of compliant pads, as will be discussed in more detail below. The attachment region of each connection component are preferably provided at the first surface of the flexible tape with the terminals preferably accessible at the second surface of the flexible tape.

A carrier frame, having a top surface and a bottom surface, is typically provided for processing the flexible tape. The carrier frame is desirably between approximately 250–400 microns thick and comprises a rigid material, such as a metal or plastic. The carrier frame has one or more inner edges which define a slot extending between the top and bottom surfaces thereof. In certain preferred embodiments the slot is elongated and the carrier frame includes a cut-out region which is contiguous with one end of the slot, whereby the width of the cut-out region is greater than the width of the slot.

In further stages of preferred assembly methods, the flexible tape is placed on a top surface of a work holder and the carrier frame is placed over the flexible tape so that the second surface of the flexible tape (i.e., the terminal side) is in contact with the surface of the carrier frame. The width of the flexible tape is greater than the width of the slot. Therefore, when the flexible tape overlies the carrier frame and is substantially parallel to and in contact therewith, the side border regions of the tape preferably extend beyond the one or more of the inner edges of the carrier frame. However, the width of the cut-out region is greater than the width of the flexible tape so that portions of the flexible tape overlying the cut-out region are typically bounded by the cut-out region.

In further stages of the process, one end of the flexible tape is secured to the carrier frame and is preferably hingedly or pivotally secured thereto. In certain preferred embodiments, the portion of the flexible tape extending into the cut-out region is pivotally secured to the carrier frame by affixing flexible strips to the border regions of the flexible tape overlying the cut-out region. The flexible strips may be removed and desirably include an adhesive thereon which secures to the border region of the tape. In certain preferred embodiments, each flexible adhesive strip has a first end connected to the border regions of the flexible tape overlying or extending into the cut-out region and a second end connected to the carrier frame.

In the next stage of the process, during a first processing operation, a resilient element is provided over the attachment region of each connection component. The resilient element may be provided by forming a plurality or array of compliant pads on each attachment region, such as by using the methods described in the aforementioned U.S. Pat. No. 5,659,952. The compliant pads are preferably formed by stenciling or screen printing an array of individual pads on each attachment region, whereby the array includes channels running between adjacent pads. During the step of providing the resilient elements on the attachment regions of the connection components, the flexible tape is maintained in a substantially stationary position over the top surface of the carrier frame by supporting the underside of the flexible tape. This underside support may be provided using a supporting element, such as a support plate, which passes through the slot in the carrier frame and engages the second surface of the flexible tape to prevent the flexible tape from flexing or moving downward during the providing a resilient element step. Although the present invention is not limited by any particular theory of operation, it is believed that the formation of properly aligned and shaped resilient elements is greatly facilitated when the bottom of the stencil is in direct contact with the first surface of the flexible tape. This direct contact is not possible when the carrier frame lies between the bottom of the stencil and the flexible tape. For example, if the flexible tape was under the carrier frame, rather than overlying the top of the carrier frame, then it would be impractical to place the bottom of the stencil directly in contact with the first surface of the flexible tape because the stencil would be spaced from the first surface of the tape by the carrier frame. As mentioned previously, this could result in the formation of misaligned and improperly shaped compliant pads on the various attachment regions of the connection components. The compliant pads may then be at least partially cured, such as by using heat or ultraviolet light. In other embodiments, the compliant pads may not be cured until after die attach, as will be discussed in more detail below.

After the compliant pads are formed on the attachment regions of the flexible tape, the tape is preferably passed through the slot in the carrier frame by disengaging the borders of the tape from the top surface of the carrier frame, passing the tape through the slot and re-engaging the borders of the tape with the bottom surface of the carrier frame. In accordance with one preferred embodiment of the present invention, the flexible tape initially overlies the top surface of the carrier frame with the second surface of the tape in contact with the carrier frame and with one end of the tape pivotally connected to the carrier frame. Preferably, the portion of the flexible tape which is pivotally connected to the carrier frame is that portion which overlies the cut-out region of the slot. As the flexible tape is held in a substantially stationary position, one end of the carrier frame is rotated about the pivotally secured portion of the flexible tape. The carrier frame is rotated upward between approximately 15–60° and preferably between approximately 25–35° from the initial or first position toward a second position. As the carrier frame moves toward the second position, the second surface of the flexible tape disengages from the top surface of the carrier frame and passes through the slot. After the flexible tape has disengaged from the top surface and passed through the slot, the carrier frame is then rotated downward approximately 25–35° from the second position back toward the first position, and preferably all the way back to the first position, so that the bottom surface of the carrier frame engages or is in contact with the first surface of the flexible tape. During the passing the flexible tape step, the flexible nature of the tape permits the border regions of the flexible tape to move or flex toward one another so that the tape may pass freely through the slot. If the side borders of the tape were not capable of flexing inwardly, then the tape could not readily pass through the slot because, as mentioned above, the width of the flexible tape is greater than the width of the slot. After the passing step, the first surface of the flexible tape is in contact with the bottom surface of the carrier frame and the slot in the carrier frame overlies and is in substantial alignment with the central region of the flexible tape so that the slot overlies the connection components, which in turn are accessible through the slot. In this stage of the assembly process, the resilient elements on the respective connection components face upwardly in the slot.

In the next stage of the assembly process, during a second processing operation, microelectronic elements, such as semiconductor chips having contacts on a front face thereof, are assembled with the resilient elements of each connection component to provide microelectronic assemblies. The chips are preferably assembled to the resilient elements by abutting the chips against the resilient elements. During the assembling step, the flexible tape is maintained in a substantially stationary position, such as by using a supporting plate, to prevent the tape from flexing or moving. Supporting the underside of the flexible tape at this stage is important because if the tape flexed downward during assembly of the microelectronic elements, then the elements could possibly be misaligned over the connection components, thereby resulting in the production of defective chip assemblies.

After the die attach or assembly step, the microelectronic elements and the connection components are electrically interconnected, such as by bonding the flexible leads of the connection components to the contacts on the microelectronic elements, or by other known connecting processes. A curable liquid encapsulant, such as silicone elastomer, may then be provided between the microelectronic elements and the connection components. The curable liquid encapsulant preferably flows between the microelectronic element and the connection component, through the channels between the compliant pads and around the flexible leads. In certain embodiments, one or more coverlays may be used to prevent the liquid encapsulant from flowing into contact with the second surface of the connection components and/or surfaces of the chips, such as the back surfaces of the chips. The curable liquid encapsulant may then be cured using heat or ultraviolet light to provide a compliant interface for each microelectronic assembly. The cured encapsulant also protects the final assembly, including the flexible leads, from contamination. The assemblies may then be severed from the flexible tape by cutting around the perimeter of the assembly to provide individual microelectronic assemblies, or groups of two or more assemblies, capable of being interconnected with external circuit elements such as printed circuit boards.

In further preferred embodiments, the slot in the carrier frame is an elongated slot having first and second ends and first and second sides, and the cut-out region at one end of the slot is contiguous with either the first or second end of the slot. The flexible tape preferably includes an elongated strip having an array of connection components, such as an array of connection components aligned in a 3×10 matrix. The sides of the flexible tape are preferably bound by border regions on opposite sides thereof so that when the flexible tape overlies the carrier frame, and is substantially parallel thereto, the side border regions of the flexible tape extend beyond the sides of the elongated slot. However, the side border regions of the flexible tape extending into the cut-out region do not extend beyond the sides of the cut-out region because the width of the cut-out region is greater than the width of the flexible tape. Thus, during the pivotally securing steps described above, when the flexible strips are applied, to pivotally secure the tape to the carrier frame, the one or more strips are preferably attached to the portions of the side border regions extending into the cut-out region. Without the oversized cut-out region, it would be difficult to pass or transfer the flexible tape from one surface of the carrier frame to the opposite surface of the carrier frame while the flexible tape remained secured to the carrier frame.

Thus, by using a carrier frame having an elongated slot and a cut-out region as described above, it is possible to easily handle and manipulate the connection components and microelectronic assemblies through all of the assembly steps to the final severing operation. The flexible tape can be easily moved between the top and bottom surfaces of the carrier frame to provide unfettered access to the first and second surfaces of the flexible tape as required during different stages of the assembly process. The ability to quickly and easily transfer the tape from the top of the carrier frame to the bottom of the carrier frame simplifies the assembly process and minimizes handling of the flexible tape and the microelectronic elements. Moreover, the carrier frames can be readily manipulated (i.e. inverted) during the various assembly steps and are inexpensive to manufacture.

In another embodiment of the present invention, the carrier frame is substantially similar to that described above; however, the elongated slot includes teeth or projections which extend from opposite sides of the slot and toward the center of the slot. The side borders of the flexible tape contact the teeth to maintain the tape on the top or bottom surface of the carrier frame, as may be required during various stages of the assembly process. The flexible tape is pivotally connected to the carrier frame so that the tape can pivot between engagement with the top and bottom surfaces of the carrier frame as described above.

In another embodiment, an apparatus for processing flexible tape pivotally secured to a carrier frame which has a top surface and a bottom surface and a slot extending therebetween includes a base having a top surface and a bottom surface and including an aperture extending therebetween and a platform having a top surface and being sized to fit within the aperture in the base. The base is pivotally secured to one end of the platform and is movable between a first position wherein the top surface of the base is substantially parallel to the top surface of the platform and a second position wherein the top surface of the base has been pivoted between approximately 15–60°, and preferably between 25–35° above the top surface of the platform. The carrier frame includes alignment apertures and the top surface of the base includes alignment posts so that the carrier frame may be aligned over the top surface of the base, whereby the slot in the carrier frame is aligned over the aperture in the base and the platform. The apparatus also includes a clamp which has a perimeter which is sized to pass through the slot in the carrier frame and the aperture in the platform so that the clamp may secure the flexible tape to the top surface of the platform as the platform moves between the first and second positions. The platform includes a securing element at the top surface thereof, such as a plurality of vacuum holes. The clamp and the vacuum holes cooperatively secure the flexible tape to the top surface of the platform as the base pivots between the first and second positions. The top surface of the platform is approximately 500–700 microns higher than the top surface of the base when the base is in the first position.

The foregoing and other objects and advantages of the present invention will be better understood from the following detailed description of preferred embodiments taken together with the attached figures.

BRIEF DESCRIPTION OF THE DRAWINGS

FIG. 10B shows a fragmentary side view of the flexible tape while compliant pads are being formed on the first surface thereof.

FIG. 10C shows a top fragmentary view of the flexible tape shown in FIG. 10B after the compliant pads have been formed thereon.

FIG. 11 shows a perspective view of a pivoting apparatus for processing the flexible tape shown in FIGS. 1A–1C.

DETAILED DESCRIPTION OF PREFERRED EMBODIMENTS

Figure 1A:
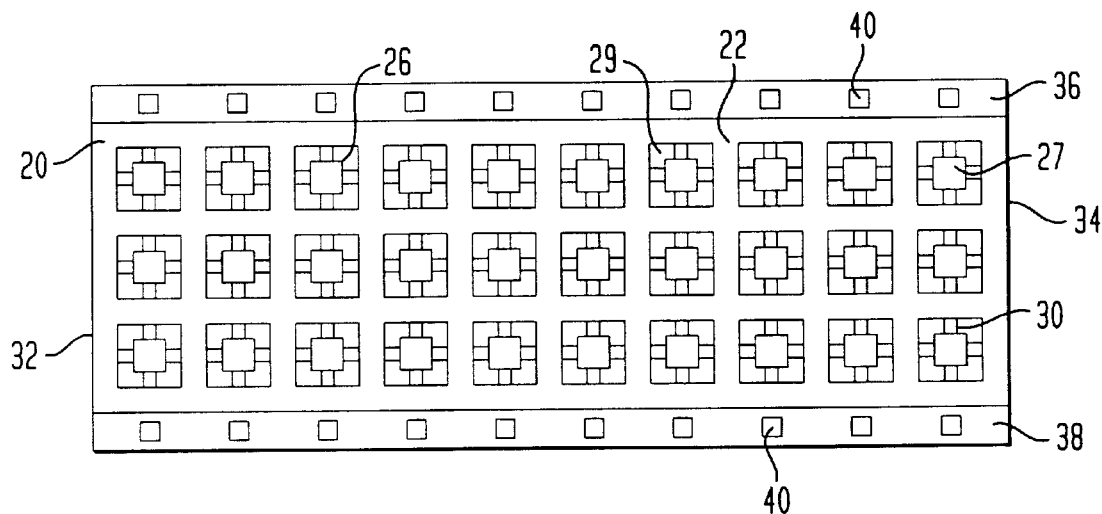
FIG. 1A shows a top view of a first surface of a flexible tape including a plurality of connection components according to one embodiment of the present invention.
Figure 1B:
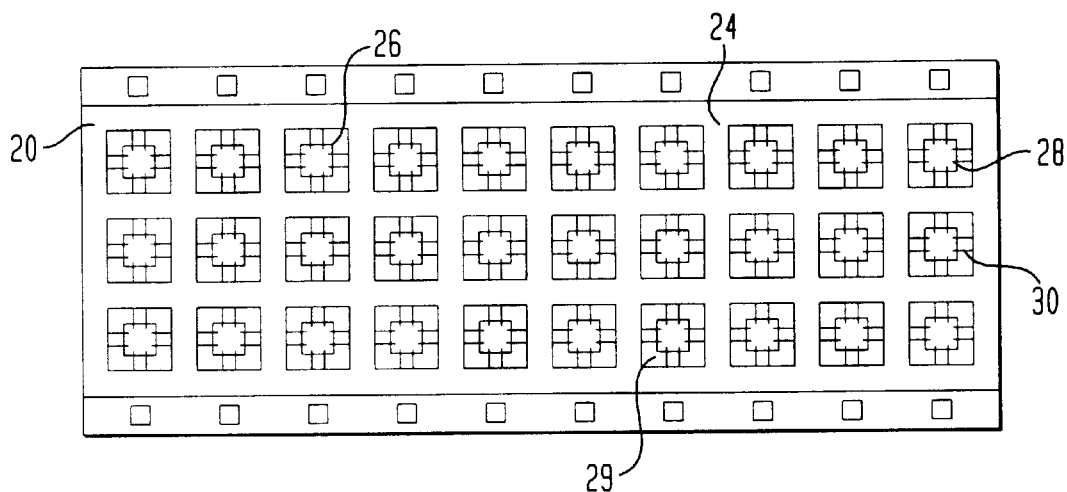
FIG. 1B shows a bottom view of FIG. 1A depicting a second surface of the flexible tape.
Figure 1C:
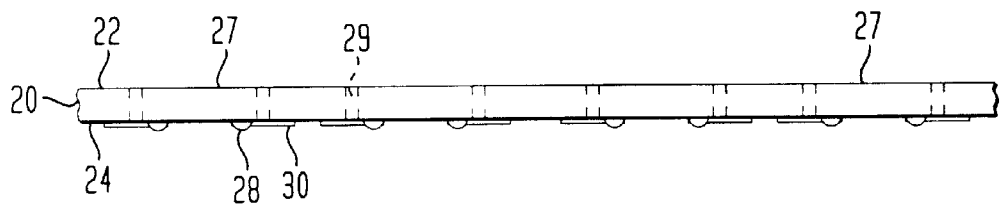
FIG. 1C shows a fragmentary side view of FIG. 1A.

Referring to FIGS. 1A–1C, in one embodiment of the present invention a flexible tape 20 includes a flexible sheet-like dielectric film, such as a polymeric material, and has a first surface 22 and a second surface 24. The flexible tape includes a plurality of connection components 26 which are arranged in a 3×10 array. The flexible tape strip 20 is provided by severing a section of the tape from a continuous reel. Each connection component 26 includes a part of the flexible dielectric film having an attachment surface 27 at the first surface 22 of the flexible tape and a plurality or array of terminals 28 at the second surface of the flexible tape. Each connection component 26 also includes flexible leads 30 integrally connected to the terminals 28. Each connection component 26 serves as a compliant interface for a microelectronic element (not shown), such as a semiconductor chip, so that the microelectronic element may be electrically connected to an external circuit element via the connection component 26. The connection component 26 is preferably formed from a polymeric material such as KAPTON(E) available from DuPont Chemical Corporation having an approximate thickness between 25 to 75 microns. The connection component 26 includes bond windows 29 for accessing the flexible leads 30 in order to bond the flexible leads 30 to contacts on the microelectronic element during a bonding operation, as will be discussed in more detail below. The array of connection components 26 are disposed within a central region of the flexible tape 20. The tape 20 has a first end 32 and a second end 34 and side portions which are bounded by a first border 36 and a second border 38. The side borders 36 and 38 include sprocket holes 40 formed therein for handling and moving the flexible tape 20 during fabrication of the tape and during the various assembly steps.

Figure 2A:
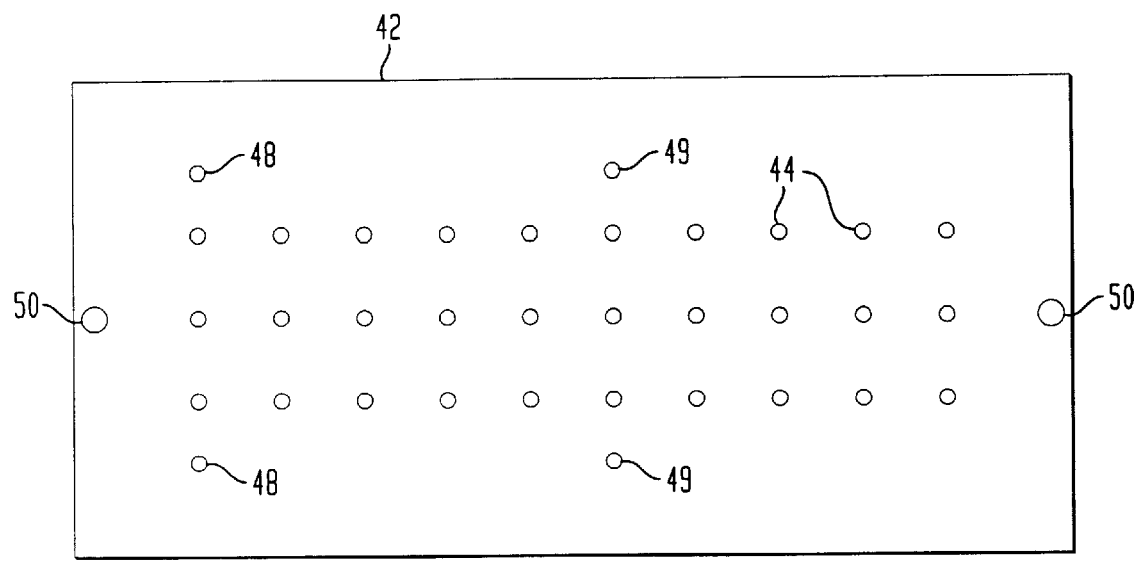
FIG. 2A shows a top view of a work holder for supporting the flexible tape shown in FIGS. 1A–1C.
Figure 2B:
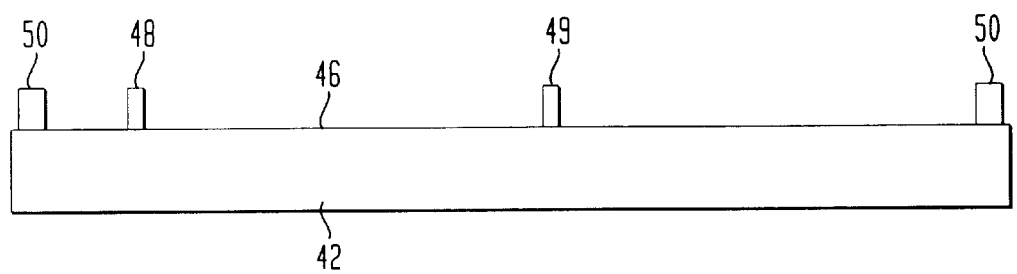
FIG. 2B shows a side view of FIG. 2A.

FIGS. 2A and 2B show a work holder 42 for supporting the flexible tape 20 during certain stages of the assembly process. The work holder 42 includes an array of vacuum holes 44 formed at the top surface 46 of the work holder 42. When the flexible tape 20 is placed on the top surface 46 of the work holder 42, the vacuum holes 44 are preferably in substantial alignment with the central region of the flexible tape 20. The work holder 42 also includes a first set of tape alignment posts 48 and a second set of tape alignment posts 49 for aligning the flexible tape 20. During an alignment operation, two or more of the sprocket holes 40 are aligned with the tape alignment posts 48 and 49 as the flexible tape 20 is lowered onto the top surface 46 of the work holder 42. The flexible tape 20 may be removed from the top surface of the work holder 42 and realigned if visual observation indicates that the flexible tape 20 has not been properly aligned on the work holder 42. The work holder 42 also includes a set of carrier frame alignment posts 50 projecting from the top surface thereof. The carrier frame alignment posts 50 are used to align the carrier frame over the work holder, as will be described in more detail below.

Figure 3A:
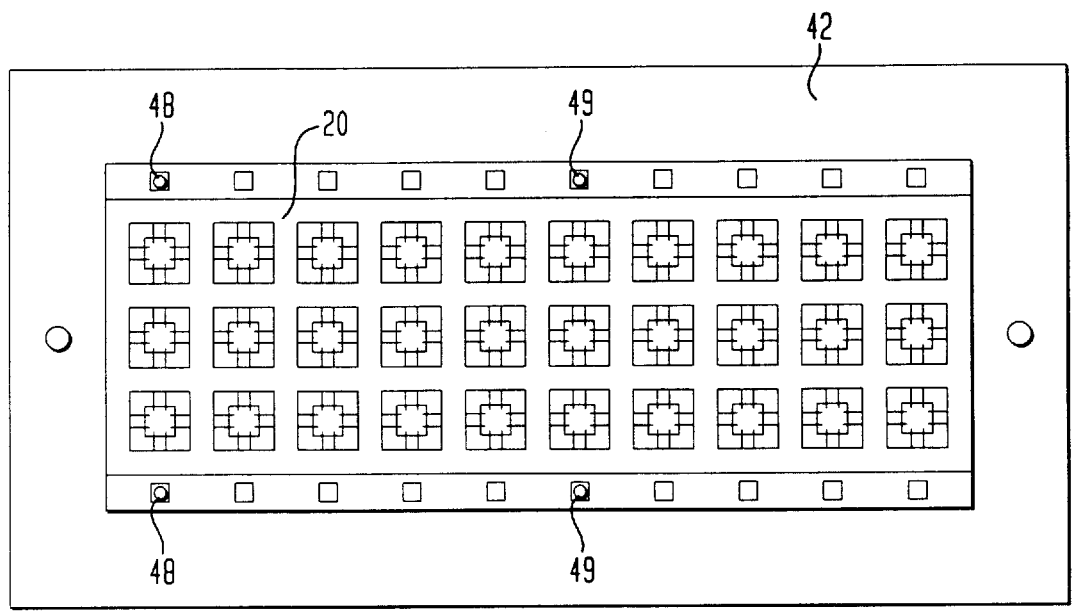
FIG. 3A shows a top view of the flexible tape shown in FIGS. 1A–1C on the work holder shown in FIGS. 2A–2B.
Figure 3B:
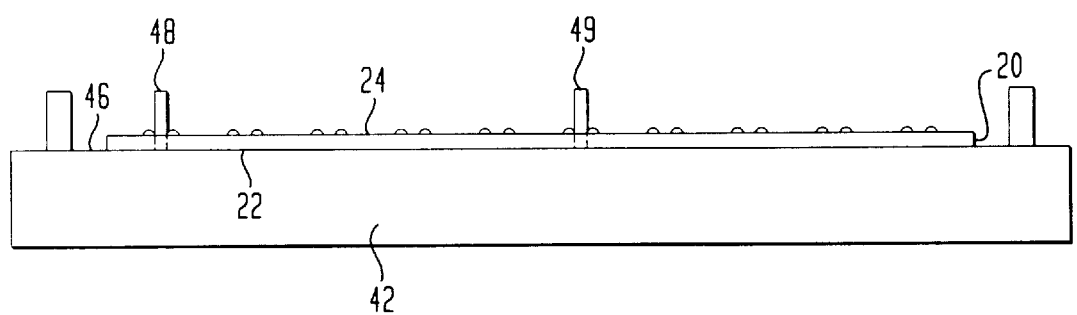
FIG. 3B shows a side view of FIG. 3A.

FIGS. 3A and 3B show the flexible tape 20 after the tape has been aligned with the tape alignment posts 48 and 49 positioned on the work holder 42. The flexible tape 20 is positioned on the work holder 42 so that the first surface 22 of the flexible tape 20 is in contact with the top surface 46 of the work holder 42 and the second surface 24 of the tape 20 faces away from the top surface 46 of the work holder 42.

Figure 4A:
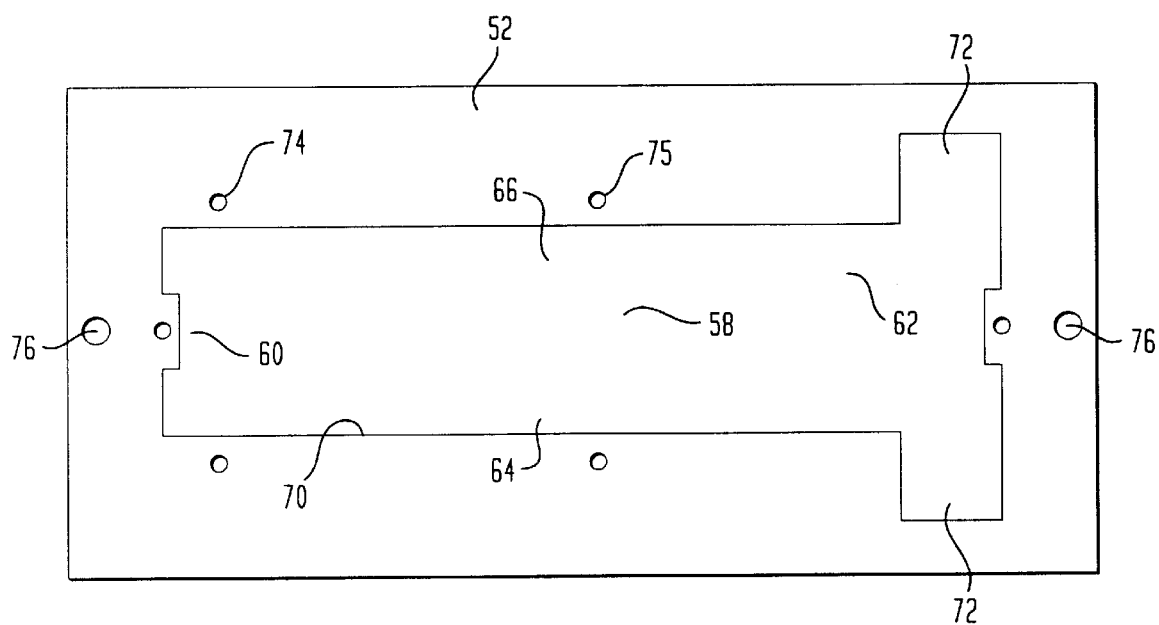
FIG. 4A shows a top view of a carrier frame used in one embodiment of a method of making microelectronic assemblies according to the present invention.
Figure 4B:
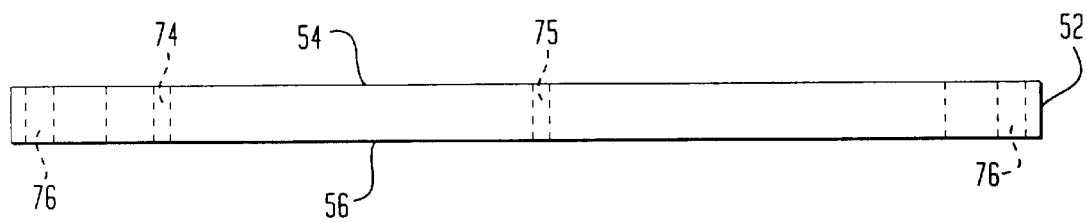
FIG. 4B shows a side view of FIG. 4A.

Referring to FIGS. 4A and 4B, in the next stage of the assembly process, a carrier frame 52 having a top surface 54 and a bottom surface 56 and including an elongated slot 58 formed in the center thereof is provided. The slot 58 has a first end 60 and a second end 62 and first and second opposed sides 64 and 66 which are defined by one or more interior edges 70 of the carrier frame 52. The carrier frame 52 also includes a cut-out region or portion 72 integral with the second end 62 of the slot 58. The width of the cut-out portion 72 is greater than the width of the slot 58 for reasons which will be explained in more detail below. The carrier frame includes tape alignment apertures 74 and 75 for receiving the respective flexible tape alignment posts 48 and 49 of the work holder when the carrier frame 52 is placed over the work holder 42 and a second set of apertures 76 for receiving the carrier frame alignment posts 50.

Figure 5A:
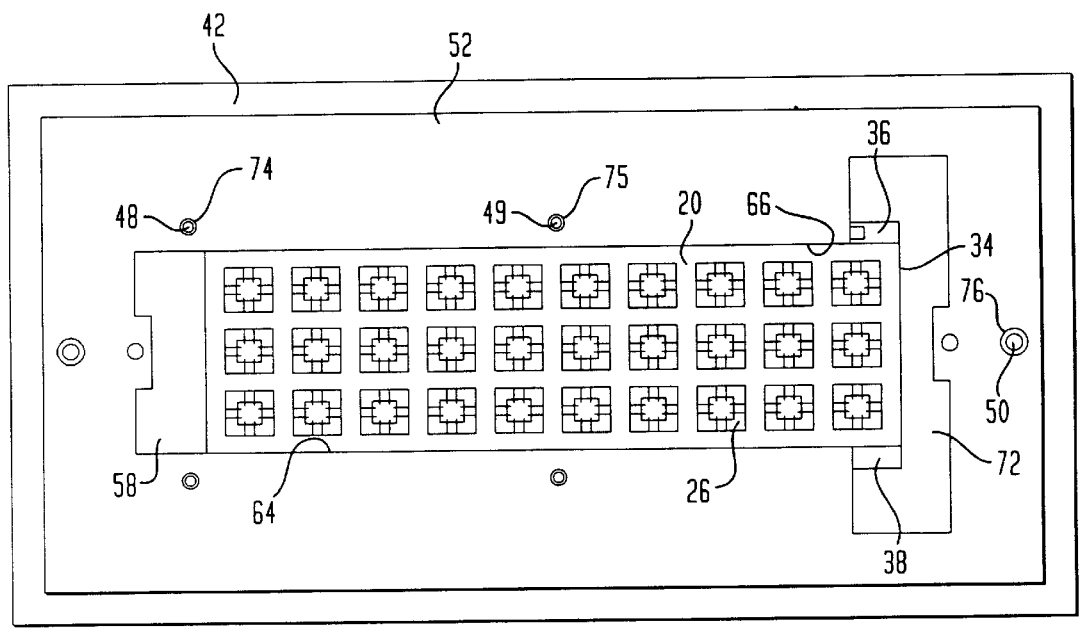
FIG. 5A shows a top view of the carrier frame shown in FIGS. 4A–4B overlying the flexible tape shown in FIGS. 1A–1C and the work holder shown in FIGS. 2A–2B.
Figure 5B:
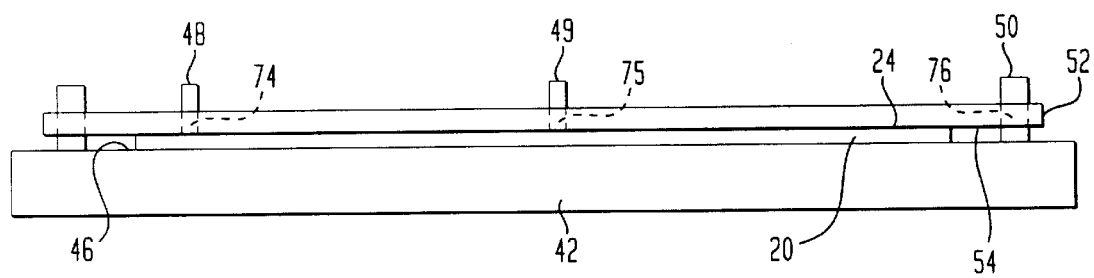
FIG. 5B shows a side view of FIG. 5A.

FIGS. 5A and 5B show further stages after the carrier frame 52 has been provided over the second surface of the flexible tape 20 and the work holder 42. During this step, the top surface 54 of the carrier frame 52 is juxtaposed with the top surface 46 of the work holder 42. The slot 58 in the carrier frame 52 overlies the central region of the flexible tape 20 including the plurality of connection components 26. Before the carrier frame 52 is positioned over the work holder 42, the flexible tape alignment posts 48 and 49 are aligned with the respective tape alignment apertures 74 and 75 in the carrier frame 52 and the carrier frame alignment posts 50 are aligned with the carrier frame alignment apertures 76 in the carrier frame 52. The carrier frame 52 is then lowered into engagement with the top surface 46 of the work holder 42 so that the top surface 54 of the carrier frame 52 is in contact with the second surface 24 of the flexible tape 20. The width of the flexible tape 20 is greater than the width of the slot 58 so that the side borders 36 and 38 extend beyond the sides 64 and 66 of the slot 58. However, the second end 34 of the flexible tape 20 which extends into the cut-out region 72 is bounded by the cut-out region so that the borders are visible and can be accessed from the bottom of the carrier frame 52.

Figure 6:
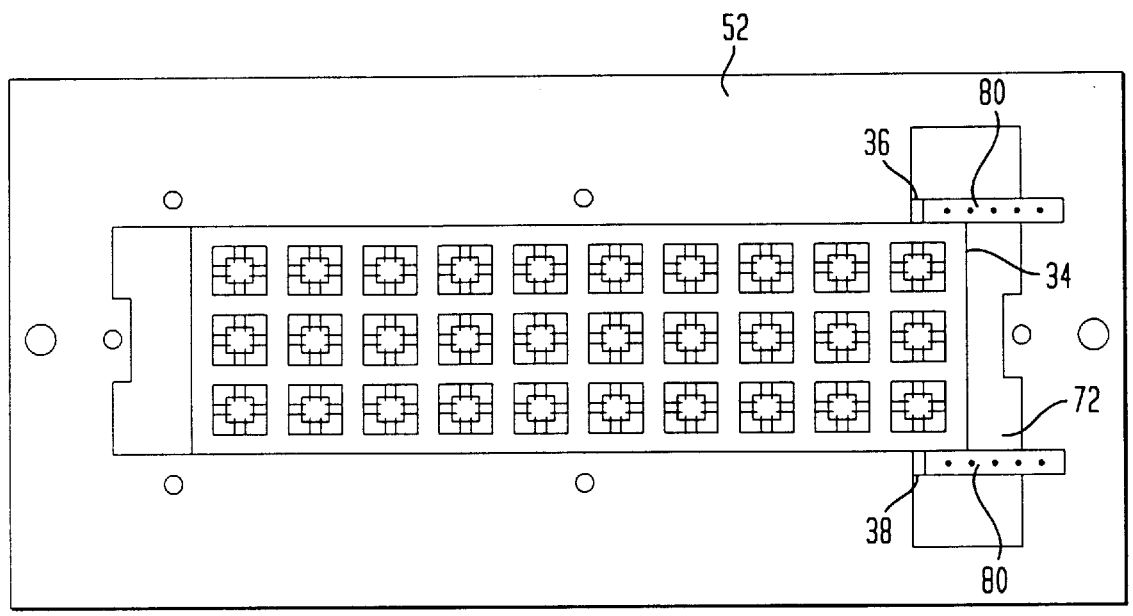
FIG. 6 shows a top view of FIG. 5A after the flexible tape has been pivotally connected to the carrier frame.
Figure 7:
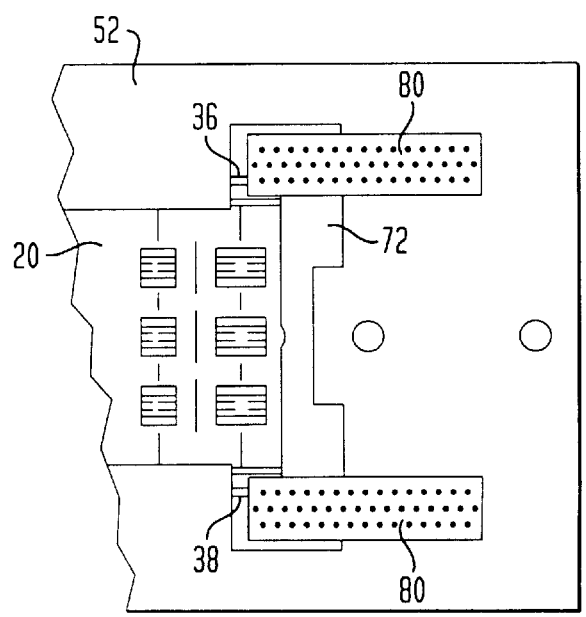
FIG. 7 shows a detailed fragmentary view of the end of the flexible tape pivotally connected to the carrier frame.

Referring to FIGS. 6 and 7, the second end 34 of the flexible tape 20 is then pivotally connected to the carrier frame 52 by placing flexible strips, such as polyimide tape strips 80, on the border regions 36 and 38 of the flexible tape 20 which extend into the cut-out region 72. FIG. 7 shows a fragmentary view of the carrier frame 52 including the polyimide tape strips 80 attached to the borders 36 and 38 of the flexible tape 20 extending into the cut-out region 72. The first ends of the tape strips 80 are attached to the flexible tape 20 and the second ends of the adhesive strips 80 are attached to the carrier frame 52 adjacent the cut-out region 72.

Figure 8A:
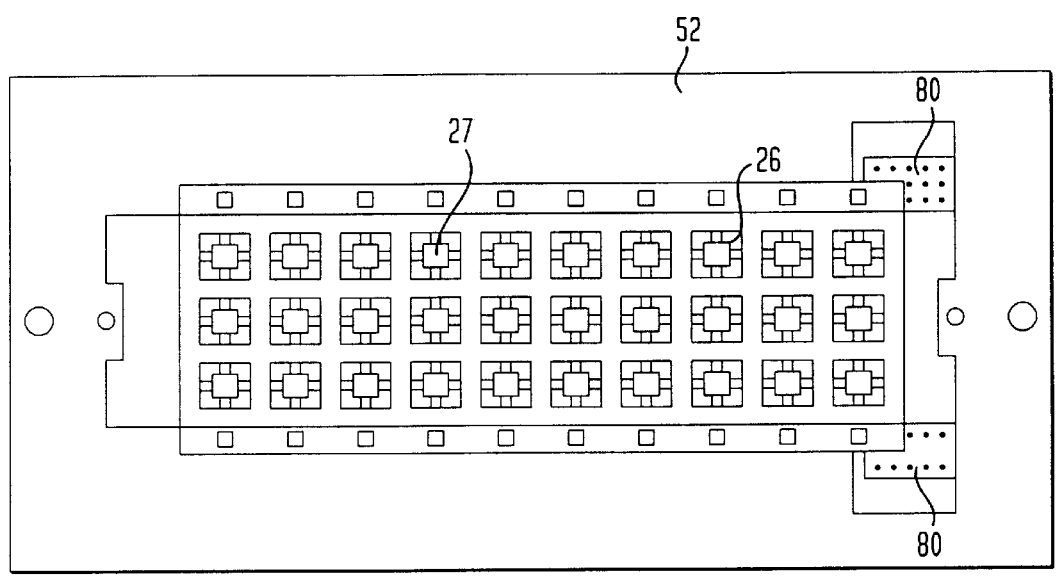
FIG. 8A shows a top view of the pivotally connected flexible tape shown in FIGS. 6 and 7 after the carrier frame has been inverted.
Figure 8B:
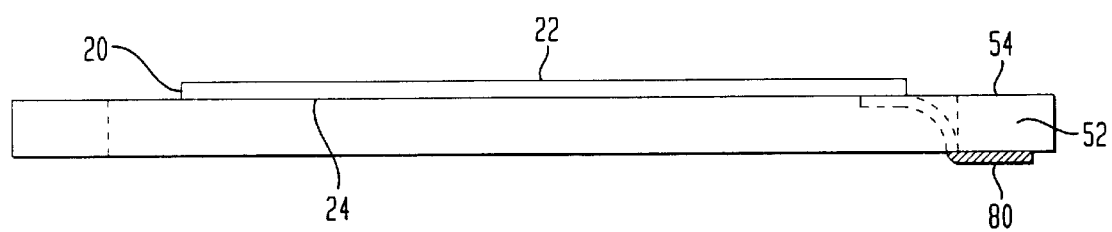
FIG. 8B shows a side view of FIG. 8A.

Referring to FIGS. 8A and 8B, after the flexible tape 20 has been pivotally connected to the carrier frame 52 by the adhesive strips 80, the carrier frame is lifted off of the work holder and the carrier frame 52 is inverted so that the top surface 54 of the frame and the first surface 22 of the flexible tape 20 (i.e., the surface bearing the attachment surfaces 27 of the connection components 26) face upwards. The second surface 24 of the flexible tape 20 remains in contact with the top surface 54 of the carrier frame 52.

Figure 9A:
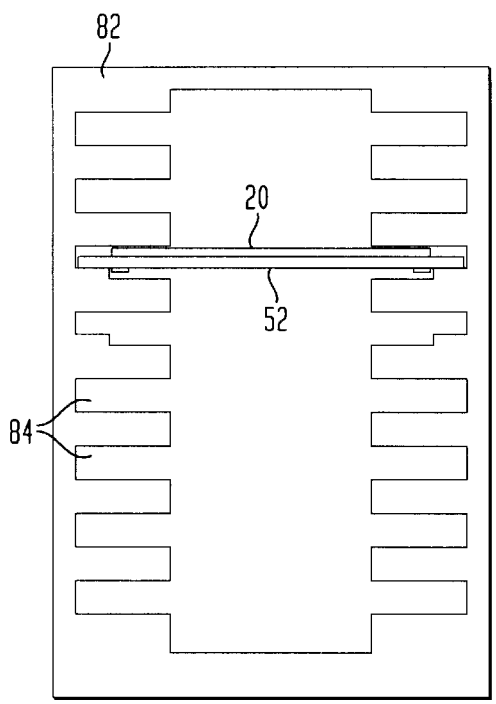
FIG. 9A shows a front view of a storage magazine used for storing the pivotally connected flexible tape shown in FIGS. 8A and 8B
Figure 9B:
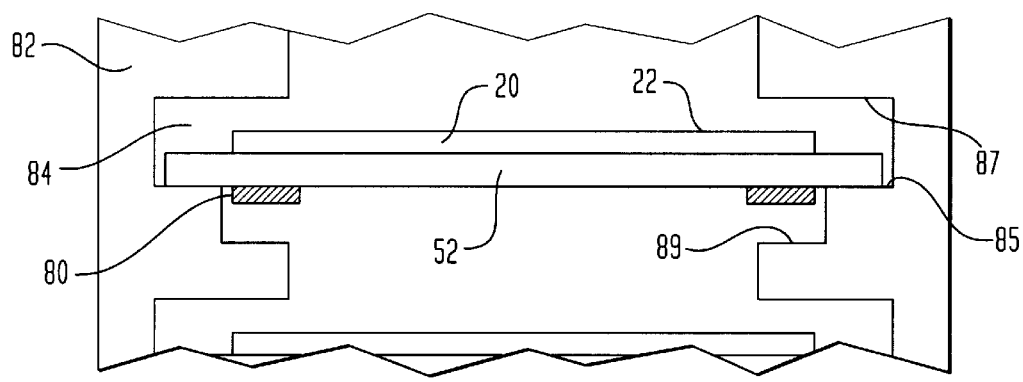
FIG. 9B shows a detailed fragmentary view of the storage magazine shown in FIG. 9A.

Referring to FIGS. 9A and 9B, the carrier frame 52 including the flexible tape 20 is then loaded into a storage magazine 82 for storing the flexible tape 20 until it is needed for further assembly steps. The magazine 82 has a plurality of slots 84. As shown in FIG. 9B, each slot is defined by lower ledges 85 and upper ledges 87 facing the lower ledges. The lower ledges are provided with recesses 89 about 0.025 inches deep. The recesses provide clearance for the flexible strips 80 so that the strips 86 are not damaged by the slots 84 when the carrier frame 52 is stored in the magazine 82. In other preferred embodiments, the carrier frame 52 is not rotated after the flexible strips 86 are attached to the flexible tape 20. In these embodiments, the carrier frames 52 are directly loaded into the magazine slots 84 for storage and after a predetermined number of carrier frames have been stored inside the magazine 82, the entire magazine is rotated so that the first surfaces 22 of the flexible tapes 20 face upward.

Figure 10A:
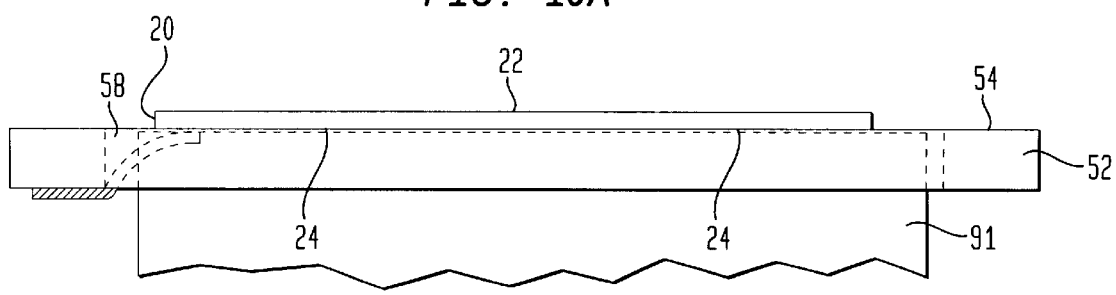
FIG. 10A shows the orientation of the flexible tape and the carrier frame shown in FIG. 8B after the carrier frame has been removed from the storage magazine.

In the next stage of the assembly process, the carrier frame is removed from the storage magazine 82 and oriented as shown in FIG. 10A so that the flexible tape 20 overlies the top surface 54 of the carrier frame 52. In this particular orientation, the top surface 22 of the tape 20 faces away from the carrier frame 52 and the second surface 24 of the tape 20 is in contact with the carrier frame 52. A supporting plate 91 is provided through the slot in the carrier frame to support the flexible tape 20 from flexing during further assembly steps as will be discussed below.

Referring to FIG. 10B, resilient elements may then be formed on the first surface 22 of the flexible tape 20 according to the embodiments disclosed in the aforementioned U.S. Pat. No. 5,659,952. Each resilient element preferably includes a plurality or array of compliant pads 88 which are desirably stencil printed over the attachment regions. When the resilient elements are provided on the flexible tape 20, it is critical that the flexible tape 20 overlies the top surface 54 of the carrier frame 52 so that the bottom surface 93 of a stencil 95 used to form the resilient elements may be flush against the first surface 22 of the flexible tape 20. As mentioned above, if the flexible tape 20 were in contact with the bottom surface 56 of the carrier frame 52, the thickness of the carrier frame 52 would prevent the bottom surface 93 of the stencil 95 from being flush with the first surface 22 of the flexible tape 20 which would adversely affect the alignment and the shape of the resilient elements. The supporting plate 91 prevents the flexible tape 20 from flexing when the compliant pads 88 are stencil printed thereon. After the compliant pads 88 have been provided on the top surface 22 of the flexible tape 20, the stencil 95 is removed and the compliant pads 88 are later cured as disclosed in U.S. Pat. No. 5,659,952. FIG. 10C shows a top view of one connection component 26 of the flexible tape 20 after the compliant pads 88 have been formed thereon.

Before curing, the carrier frames, with tapes and resilient elements thereon, are loaded into storage magazines identical to or substantially similar to those shown in FIG. 9A. The utilization of the storage magazine facilitates handling of the flexible tapes 20 during the curing processes and isolates the tapes from one another when they are stored in the magazine. The entire magazine can be moved into and out of a curing oven without extraordinary care in handling. After curing the resilient elements, the flexible tape 20 may then be transferred to the bottom surface of the carrier frame 52 in order to complete further assembly steps, as will be discussed in more detail below.

Figure 12A:
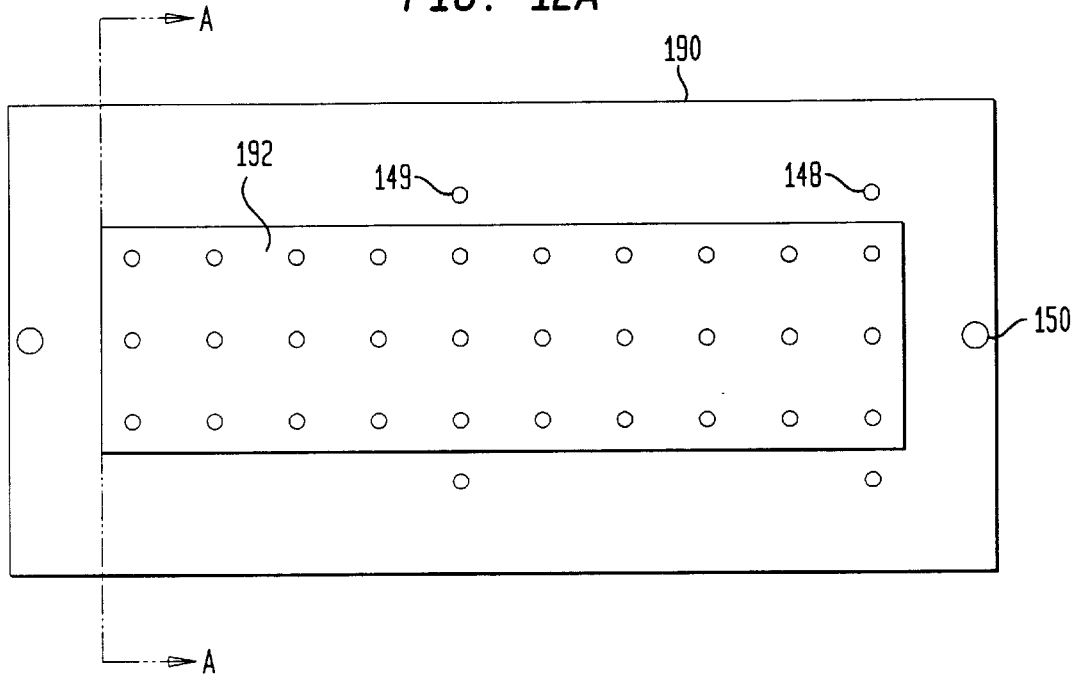
FIGS. 12A and 12B show respective top and side views of a work holder for the pivoting apparatus shown in FIG. 11.
Figure 12B:
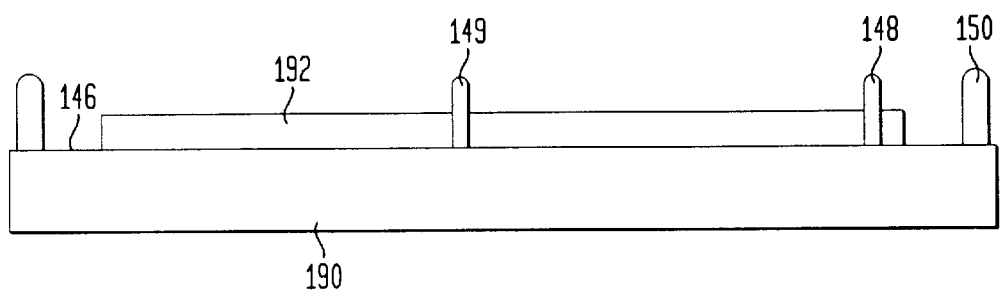
Figure 13A:
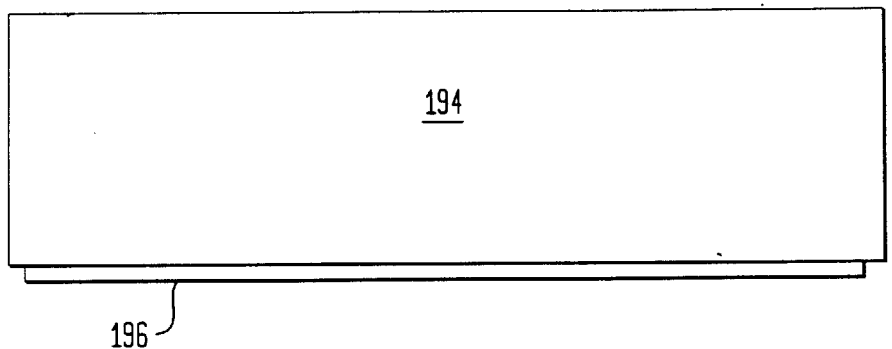
FIGS. 13A and 13B show respective side and end views of a clamp for the pivoting apparatus shown in FIG. 11.
Figure 13B:
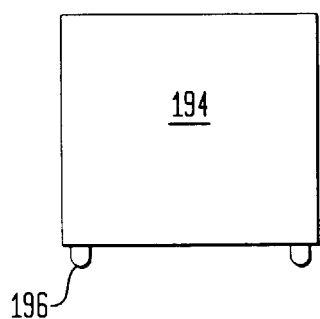
Figure 13C:
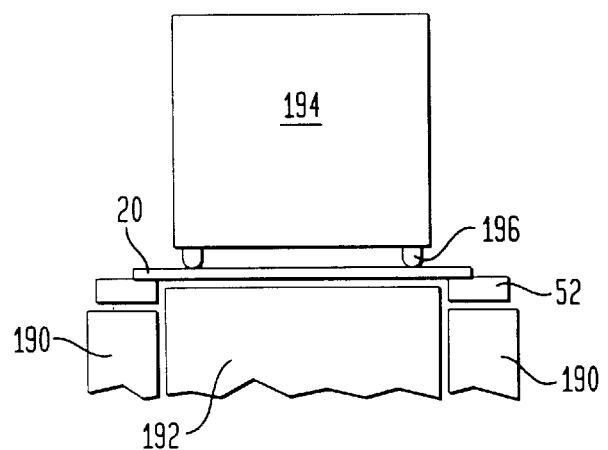
FIG. 13C shows the clamp shown in FIG. 13B in contact with the top surface of the flexible tape shown in FIGS. 1A–1C.

FIG. 11 shows a perspective view of a pivoting apparatus used in conjunction with the carrier frame 52 described above for passing the flexible tape 20 through the slot 58 in the carrier frame 52. The pivoting apparatus 142 includes three separate elements: a base 190 which pivots upwards and about an axis designated A—A; a vacuum platform 192 having vacuum holes 144, and a clamp 194 which is initially in an open or raised position directly above the vacuum platform 192. Referring to FIGS. 12A and 12B, the vacuum platform 192 is sized to fit in the center of the base 190 so that the base 190 can rotate about one end of the vacuum platform 192 along axis A—A. Initially, the top surface of the vacuum platform 192 in the center of the base 190 is approximately 500–700 microns higher than the top surface 146 of the base 190. As shown in FIGS. 13A and 13B, the clamp 194 includes contact ribs 196 which extend from one surface of the clamp 194 on opposite sides thereof. Referring to FIG. 13C, the clamp 194 is preferably sized to fit inside the center of the base 190 and the slot in the carrier frame 52 so that the clamp 194 may remain in contact with the flexible tape 20 as the base 190 pivots about one end of the flexible tape 20.

Figure 14A:
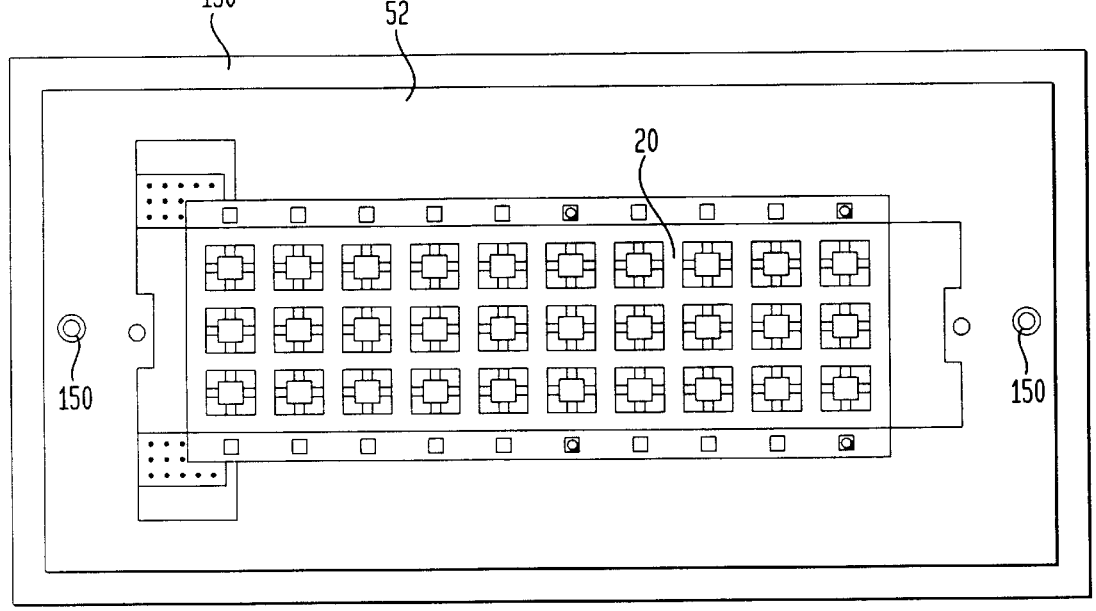
FIG. 14A shows a top view of the flexible tape and carrier frame of FIG. 10A overlying the work holder shown in FIG. 12A.
Figure 14B:
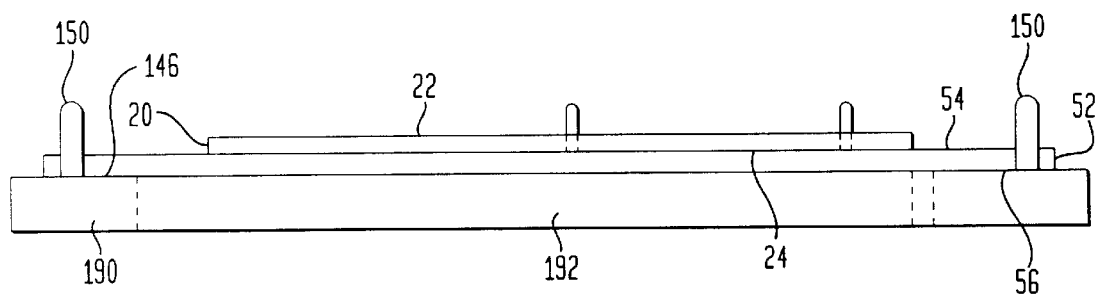
FIG. 14B shows a side view of FIG. 14A.
Figure 15A:
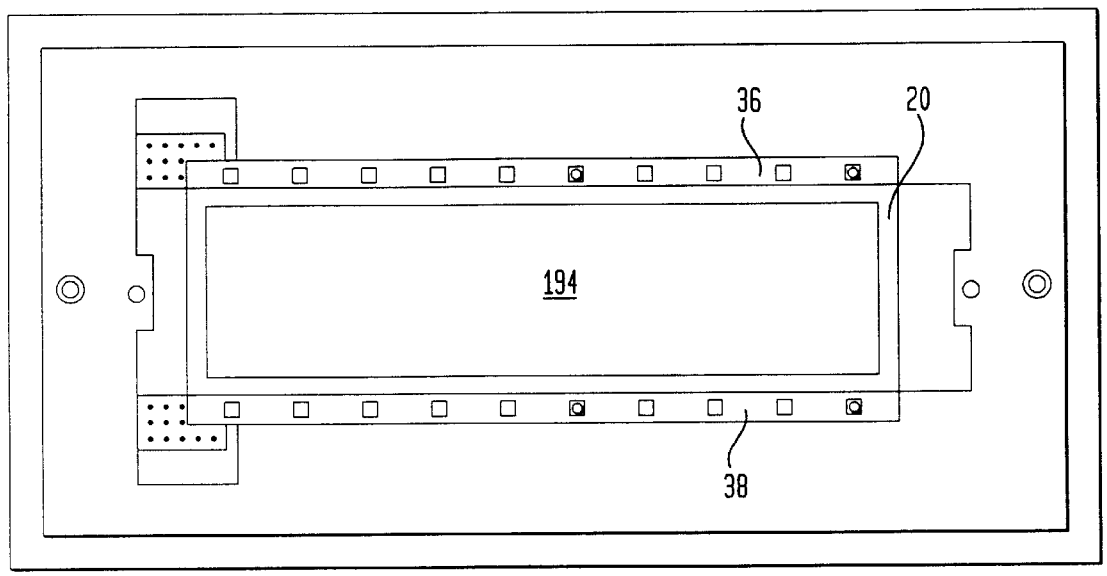
FIG. 15A shows a top view of FIG. 14A including the clamp shown in FIGS. 13A and 13B.
Figure 15B:
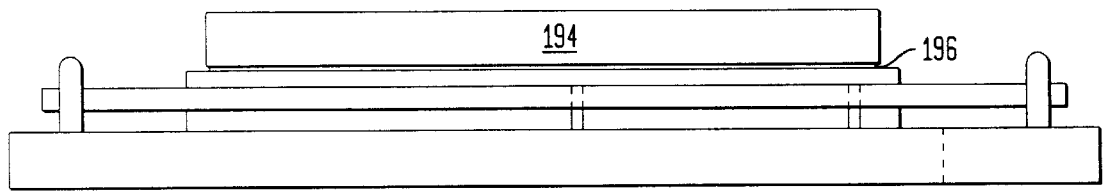
FIG. 15B shows a side view of FIG. 15A.
Figure 16A:
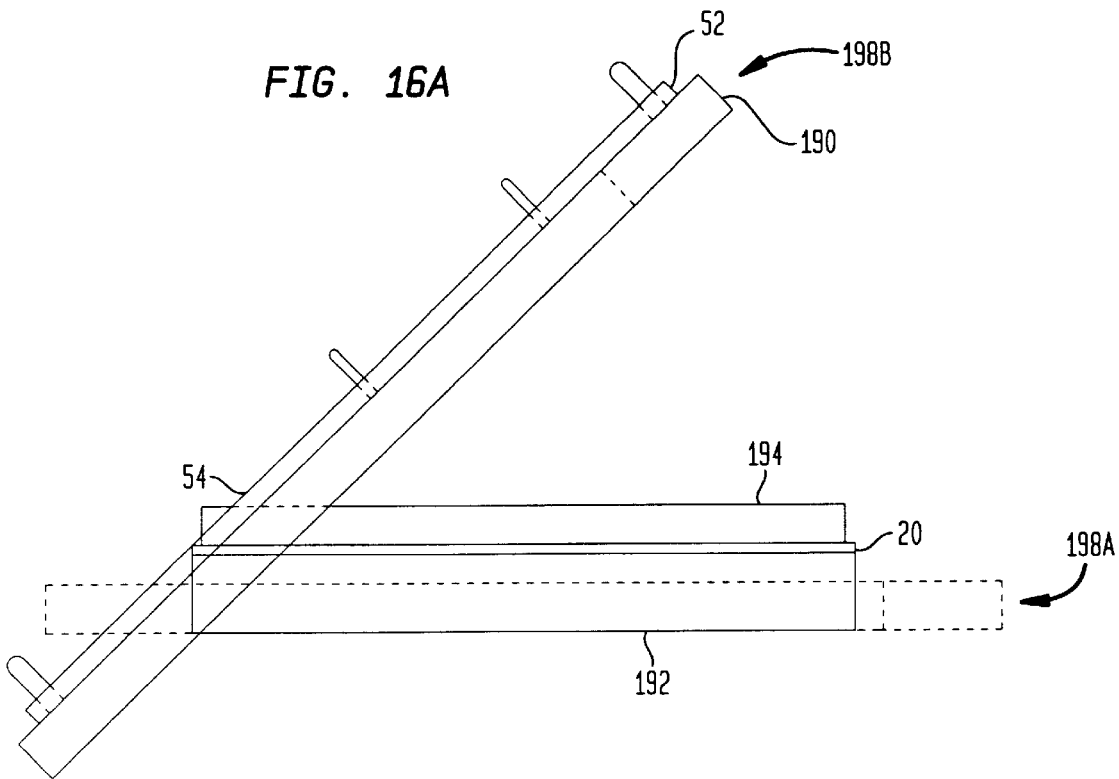
FIGS. 16A and 16B show the pivoting assembly of FIG. 15B during further stages of a method for passing the flexible tape through a slot in the carrier fame.
Figure 16B:
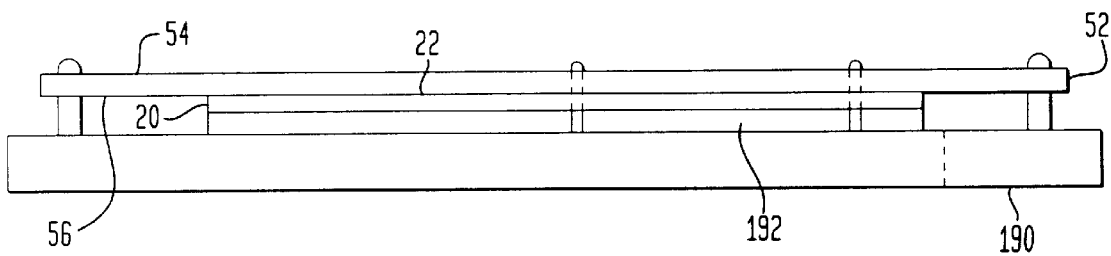

Referring to FIGS. 14A and 14B, the carrier frame 52 is then aligned with the carrier frame alignment posts 150 on the base 190 and positioned in contact with the top surface 146 of the base 190 so that the bottom surface 56 of the carrier frame 52 engages the top surface 146 of the base 190. In this particular orientation, the first surface 22 of the flexible tape 20 faces upward and away from the top surface 54 of the carrier frame 52. A vacuum is then activated through the vacuum holes 144 in the vacuum platform 192 so that the second surface 24 of the flexible tape 20 is adhered to the vacuum platform 192. As shown in FIGS. 15A and 15B, the clamp 194 is lowered until the contact ribs 196 thereon engage the flexible tape 20 adjacent the border regions 36 and 38 of the flexible tape 20. The contact ribs 196 are preferably positioned so that the ribs 196 do not engage the connection components 26 or the resilient elements formed on the connection components. The clamp 194 and the vacuum cooperatively secure the flexible tape 20 in a stationary position on the pivoting apparatus. Referring to FIG. 16A, in the next stage of the operation, while the flexible tape 20 is held stationary between the clamp 194 and the vacuum platform 192, the base 190 and the carrier frame 52 are rotated upward from a first position 198A to a second position 198B, by pivoting the base 190 and the carrier frame 52 about the A—A axis (shown in FIG. 11). In one embodiment, the base 190 and the carrier frame 52 are rotated upward between approximately 20–40°. As the carrier frame 52 is rotated upward, the borders 36 and 38 of the flexible tape 20 disengage from the top surface 54 of the carrier frame 52 and the flexible tape 20 passes through the slot 58. Referring to FIG. 16B, the carrier frame 52 and the base 190 are then rotated downward back to the first position 198A so that the bottom surface 56 of the carrier frame 52 is in contact with the first surface 22 of the flexible tape 20 and the slot 58 overlies the central region of the flexible tape 20 including the connection components 26 therein.

Figure 17A:
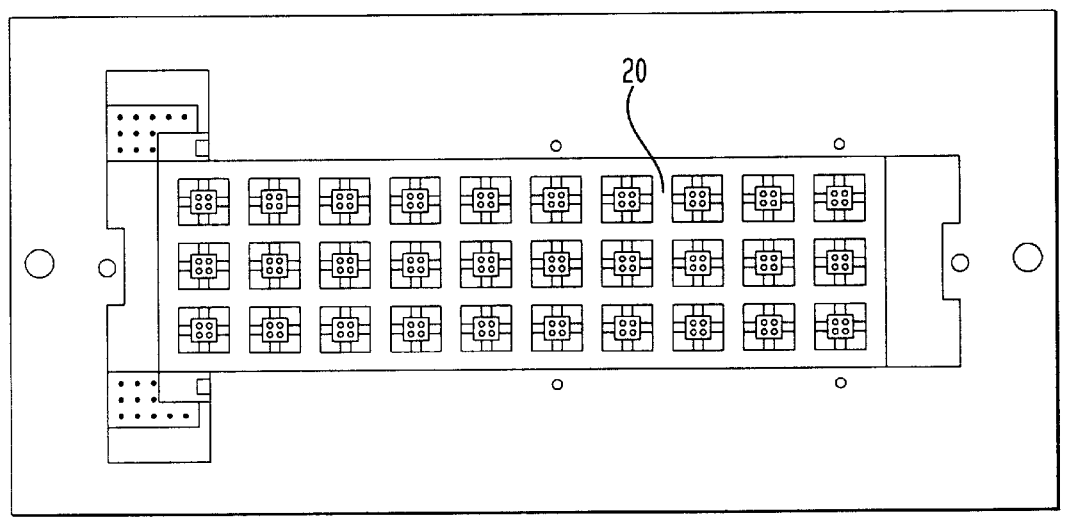
FIG. 17A shows a top view of the flexible tape after is has been passed through the slot in the carrier frame.
Figure 17B:
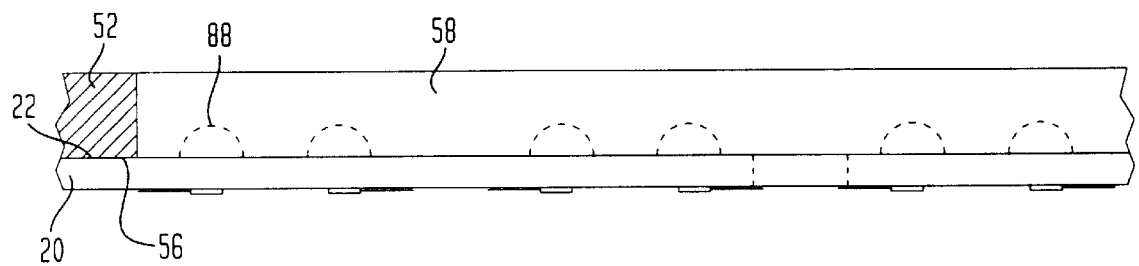
FIG. 17B shows a fragmentary side view of FIG. 17A.

FIGS. 17A and 17B show the flexible tape 20 after the tape 20 has passed through the slot 58 in the carrier frame 52 and after the carrier frame has been off-loaded from the work holder 42. At this stage, the first surface 22 of the tape 20 is in contact with the bottom 56 of the carrier frame 52 and the slot 58 overlies the connection components 26 and the compliant pads 88 formed on the connection components.

Figure 18:
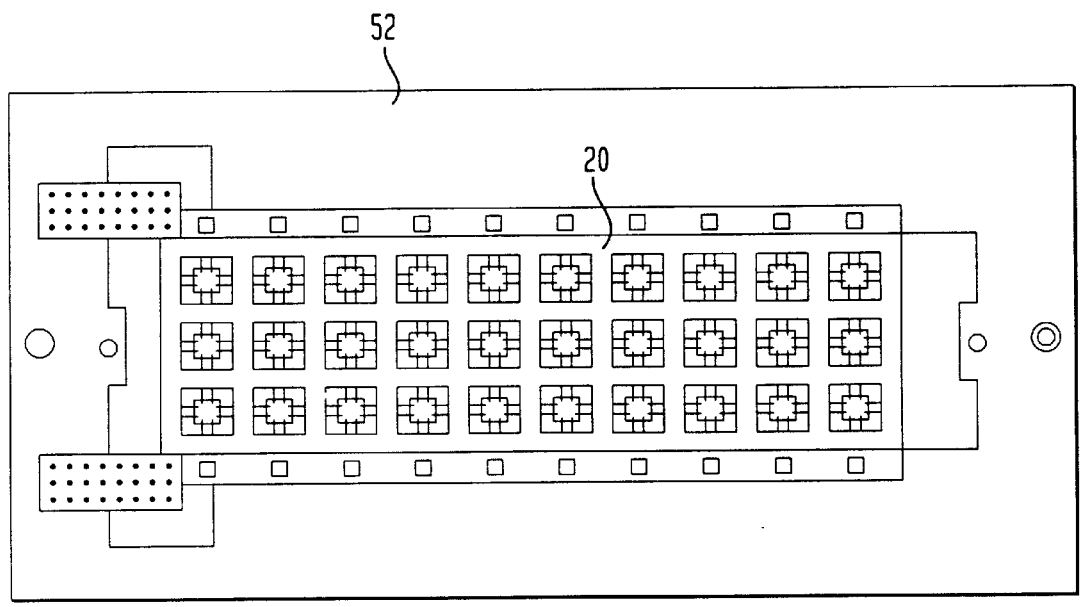
FIG. 18 shows the flexible tape of FIG. 17A after the carrier frame has been inverted.
Figure 19:
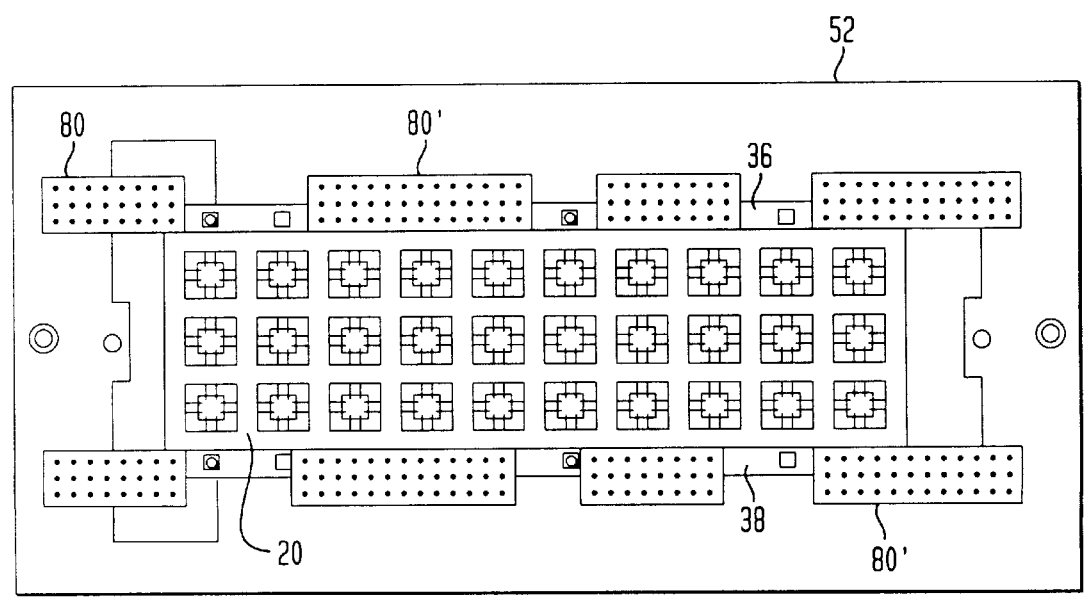
FIG. 19 shows the flexible tap shown in FIG. 18 during further stages of an assembly method according to the present invention.

Referring to FIGS. 18 and 19, the carrier frame 52 is then inverted so that the bottom surface 56 of the carrier frame 52 and the second surface 24 of the flexible tape 20 face upward. Referring to FIG. 19, additional adhesive strips 80' are then placed over the side borders 36 and 38 of the flexible tape 20 to prepare the tape for further stages of the process during which microelectronic elements, such as semiconductor chips having electrical contacts on a front face thereof, will be assembled with the connection components of the flexible tape.

Figure 20:
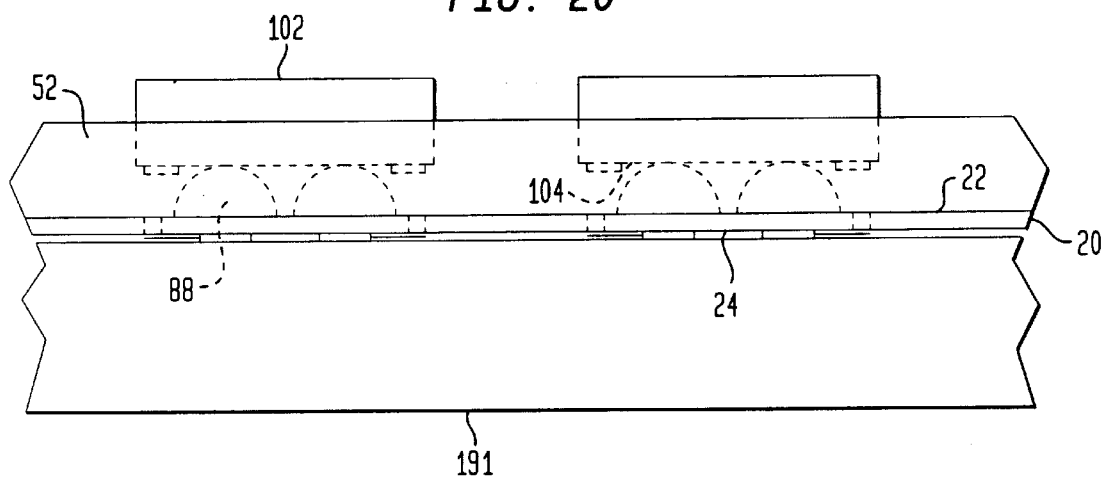
FIG. 20 shows a fragmentary side view of FIG. 19 during further stages of an assembly method according to the present invention.

FIG. 20 shows a fragmentary side view of later stages of the assembly process during which semiconductor chips 102 are assembled to the compliant pads 88 on the first surface 22 of the flexible tape 20. Before the semiconductor chips 102 are assembled to the flexible tape 20, a supporting plate 191 is preferably placed through the slot 58 in the carrier frame 52 so that the supporting plate 191 engages the second surface 24 of the flexible tape 20. After the supporting plate 191 is in place, the semiconductor chips 102 are assembled with the connection components 26 by abutting the front contact bearing faces 104 of the chips 102 against the compliant pads 88 of each connection component 26, whereby the supporting plate 191 prevents undesirable movement and flexing of the flexible tape 20 during the die attach operation.

After die attach, the carrier frame is inverted once again so that the second surface of the flexible tape is accessible for bonding the flexible leads to the contacts on the chip. A curable liquid encapsulant may then be introduced between the chips and the connection components as described in U.S. Pat. No. 5,659,952 and the encapsulant cured, using energy such as heat or ultraviolet light, to provide a compliant interface for the chip packages. After the encapsulant is cured, the assemblies may be severed from one another to provide individual microelectronic assemblies. In certain preferred embodiments, one or more coverlays may be provided over the exterior surfaces of the assemblies while the curable liquid encapsulant is introduced to prevent the encapsulant from contacting the exterior surfaces thereof as disclosed in U.S. patent application Ser. No. 08/726,697, the disclosure of which is incorporated by reference herein.

Typically, before the flexible tape is severed to provide individual assemblies, solder balls are attached to the terminals at the second surface of the flexible tape. Attachment of the solder balls enables the terminals to be electrically connected to an external circuit element, such as a printed circuit board (PCB). One preferred method for attaching solder balls includes providing a flux material over the terminals, such as by using a stencil having an array of holes extending therethrough. After the array of holes are aligned over the terminals, the flux is forced through the holes to form flux pads over each of the terminals. Solder balls are then placed on the array of flux pads using a second stencil fixture having a plurality of holes. A sweeper plate may be used to sweep the solder balls over the matrix of holes.

After the solder balls have been disposed on the flux pads the solder balls are reflowed to form a permanent bond with the terminals. There are a number of methods which can be used to reflow solder balls. In one preferred embodiment, the flexible tape including the solder balls is placed on a belt which passes the flexible tape through a furnace. In the furnace, the solder balls are heated above a reflow temperature or melt point and maintained at that temperature for approximately 30–45 seconds. The solder balls are then cooled down below the reflow temperature at which point the solder balls solidify. The flexible tape and reflowed solder balls may then be processed to remove excess flux therefrom. The flux removal process, generally referred to as defluxing, can be either a manual procedure or a fully automated procedure. In accordance with one preferred manual procedure, the flexible tape bearing the reflowed solder balls is immersed in liquid alcohol for one minute in order to soften the excess flux at the terminal sites and the flexible tape and terminals are then scrubbed with a brush to remove the excess flux therefrom.

Figure 21:
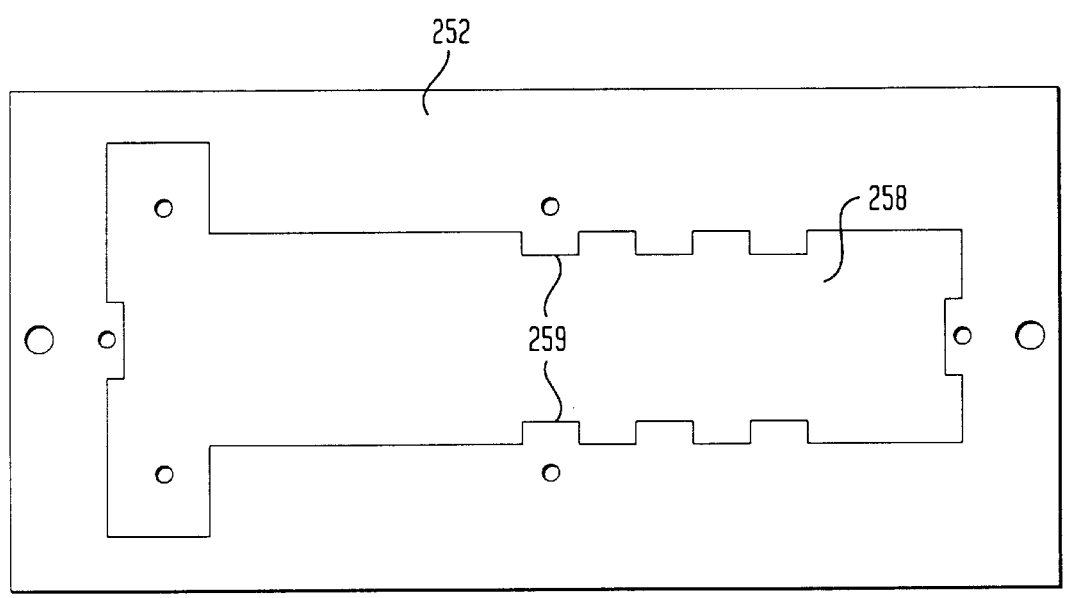
FIG. 21 shows another embodiment of the carrier frame shown in FIG. 4A.
Figure 22:
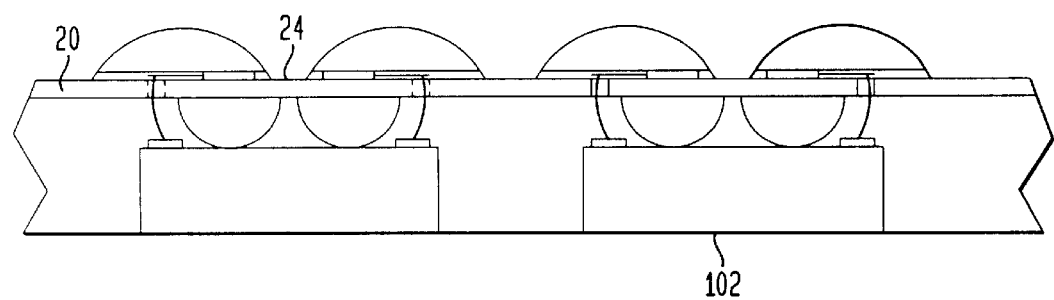
FIG. 22 shows an inverted view of FIG. 20, during still further stages of an assembly method according to the invention.

Referring to FIG. 21, in another embodiment, the carrier frame 252 has a slot 258 therein which includes a plurality of teeth 259. The plurality of teeth 259 extend from opposite sides of the slot 258, toward the center of the slot 258. The side borders of the flexible tape (not shown) preferably contact the teeth 259 to maintain the tape on the top or bottom surface of the carrier frame, as may be required during the various assembly steps described above.

As will be appreciated, numerous variations and combinations of the features discussed above can be utilized without departing from the present invention as defined by the claims. Accordingly, the foregoing description of the preferred embodiments should be taken by way of illustration rather than by way of limitation of the invention.

We claim:
1. An assembly for processing flexible tape comprising:
a carrier frame having a top surface and a bottom surface including a slot extending therebetween, said carrier frame including at least one interior edge defining said slot; and
said flexible tape being pivotally secured to at least one of said interior edges of said slot so that said flexible tape may be selectively transferred from the top surface of said carrier frame to the bottom surface of said carrier frame.

2. An assembly as claimed in claim 1, wherein the width of the flexible tape is greater than the width of said slot.

3. An assembly as claimed in claim 2, wherein said carrier frame further comprises a cut-out region contiguous with one end of said slot and extending between the top and bottom surfaces of said carrier frame, the width of said cut-out region being greater than the width of said flexible tape.

4. An assembly as claimed in claim 1, wherein the flexible tape includes a plurality of connection components in a central region of said flexible tape.

5. An assembly as claimed in claim 4, wherein each said connection component includes a dielectric film having electrically conductive parts.

6. An assembly as claimed in claim 5, wherein said electrically conductive parts include a plurality of terminals accessible at a surface of the dielectric film and flexible leads integrally connected thereto.

7. An assembly as claimed in claim 6, further comprising a plurality of solder balls attached to said terminals.

* * * * *

UNITED STATES PATENT AND TRADEMARK OFFICE
CERTIFICATE OF CORRECTION

PATENT NO.    :   6,170,151
DATED         :   January 9, 2001
INVENTOR(S)   :   Link et al.

It is certified that error appears in the above-identified patent and that said Letters Patent is hereby corrected as shown below:

Column 2, line 12, "assembly" should read --assembly,--
Column 2, line 13, "pads" should read --pads,--
Column 2, line 50, "component are" should read --component is--
Column 7, line 32, "after is " should read --after it--
Column 7, line 38, "tap" should read --tape--
Column 9, line 21, "extend" should read --extends--
Column 9, line 38, "52" should read --52,--
Column 9, line 39, "20" should read --20,--
Column 9, line 46, "86" should read --80--
Column 9, line 49, "86" should read --80--

Signed and Sealed this

Eighth Day of May, 2001

*Attest:*

NICHOLAS P. GODICI

*Attesting Officer*   *Acting Director of the United States Patent and Trademark Office*